United States Patent
Wu et al.

(10) Patent No.: US 6,635,565 B2
(45) Date of Patent: Oct. 21, 2003

(54) METHOD OF CLEANING A DUAL DAMASCENE STRUCTURE

(75) Inventors: Chih-Ning Wu, Hsinchu (TW); Chan-Lon Yang, Taipei (TW); Sun-Chieh Chien, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 17 days.

(21) Appl. No.: 09/789,357

(22) Filed: Feb. 20, 2001

(65) Prior Publication Data

US 2002/0115284 A1 Aug. 22, 2002

(51) Int. Cl.[7] .......................................... H01L 21/4763
(52) U.S. Cl. ................... 438/637; 438/622; 438/638; 438/629; 438/672; 438/675; 438/687
(58) Field of Search ................. 438/618, 622, 438/624, 626, 637, 633, 638, 629, 640, 672, 675, 687

(56) References Cited

U.S. PATENT DOCUMENTS

| | | | |
|---|---|---|---|
| 5,650,041 A | * 7/1997 | Gotoh et al. | 438/618 |
| 5,780,363 A | * 7/1998 | Delehanty et al. | 438/748 |
| 5,800,626 A | * 9/1998 | Cohen et al. | 134/1.3 |
| 5,932,022 A | * 8/1999 | Linn et al. | 134/2 |
| 6,136,693 A | * 10/2000 | Chan et al. | 438/633 |
| 6,178,972 B1 | * 1/2001 | Harada et al. | 134/1.3 |
| 6,207,569 B1 | * 3/2001 | Schonauer et al. | 438/692 |
| 6,242,331 B1 | * 6/2001 | Chu et al. | 438/586 |
| 6,245,650 B1 | * 6/2001 | Watanabe | 438/580 |
| 6,369,008 B1 | * 4/2002 | Ha et al. | 510/175 |

OTHER PUBLICATIONS

Ouimet et al. Defect Reduction and Cost Savings Through Re–Inventing RCA Cleans, IEEE, pp. 308–313.*
Miyamato et al. "Wet Chemical Cleaning for Damged Layer Removal Inside theDeep Sub–micron Contact Hole", IEEE, pp. 327–331.*

* cited by examiner

Primary Examiner—Amir Zarabian
Assistant Examiner—Maria Guerrero
(74) Attorney, Agent, or Firm—J. C. Patents

(57) ABSTRACT

A method of cleaning a dual damascene structure includes forming a first conductive layer in a substrate. A dielectric layer is formed over the substrate. A dual damascene opening is formed in the dielectric layer to expose the first conductive layer. A $H_2O_2$ based aqueous solution is used to remove polymer residues in the dual damascene opening. A temperature of the $H_2O_2$ based aqueous solution is controlled so that the first conductive layer is not corroded. A diluted HF solution or a diluted HF and HCl solution is used to remove the polymer residues. A second conductive layer is formed over the substrate to fill the dual damascene opening. A chemical mechanical polishing process is performed with the dielectric layer serving as a polishing stop to remove the second conductive layer outside the dual damascene opening. A $H_2O_2$ based aqueous solution is used to clean the hydrocarbon particulates from the chemical mechanically polishing step. A diluted HF solution or a diluted HF and HCl solution is used to remove the slurry residues, such as silicon oxide of the slurry, from the chemical mechanical polishing step.

15 Claims, 3 Drawing Sheets

METHOD OF CLEANING A DUAL DAMASCENE STRUCTURE

BACKGROUND OF THE INVENTION

1. Field of the Invention

The present invention relates to a semiconductor cleaning method. More particularly, the present invention relates to a method of cleaning a dual damascene structure.

2. Description of the Related Art

A multiple interconnection process employs dual damascene structures. Thus, the reliability of the devices is increased. In addition, the process window is also increased. As the integration of the integrated circuit increases, dual damascene technology has become a main technology in the semiconductor industry.

In a Very Large Scale Integrated (VLSI) semiconductor process, a cleaning step performed in each fabrication stage is an important factor for obtaining high-quality devices. The wafer pollution includes particulates and film contaminates. Any particle that appears on the chip surface is called a particulate, which can come from the operation workers or the operation machines, such as the quartz pipes of a high-temperature furnace, a polished film or photoresist particles, and even the particles or bacteria from the deionized wafer. In addition, the film contamination is caused by a layer of contaminates that come from the outside deposited on the wafer. The layer of contaminates that come from outside include solvent residues, the residues of the developing solvent, etc.

FIG. 1A is a schematic, cross-sectional view showing a substrate after forming and cleaning a dual damascene opening in a conventional dual damascene process.

In FIG. 1A, a substrate 100 has a copper layer 102 therein. A dielectric layer 104 is formed over the substrate 100. A dual damascene opening 120 is formed in the dielectric layer 104. Usually, after the dual damascene opening 120 is formed, a cleaning step is performed with a dilute hydrogen fluoride (HF) solution. However, polymer residues 108 cannot be completely removed after the cleaning step is performed. In addition, the HF cleaning solution overly corrodes the copper layer 102, and thus resulting in a recess surface in the copper layer 102.

FIG. 1B is a schematic, cross-sectional view showing a substrate after performing a chemical mechanical polishing and a cleaning step in the conventional dual damascene process.

In FIG. 1B, a copper layer (not shown) is formed over the substrate 100 to fill the dual damascene opening 120. A chemical mechanical polishing (CMP) step is performed to remove the copper layer on the outside of the dual damascene opening 120. A dual damascene structure 122 thus is formed. Thereafter, a cleaning step is performed using an amine-containing solution, such as an ESC780 solution. However, as shown in FIG. 1B, hydrocarbon particulates 109, which are generated from the reaction between the dielectric layer 104 and the CMP slurry, and slurry residues 110 still remain on the surface of the dual damascene structure 122 after the cleaning step is performed.

Therefore, the disadvantage of the conventional method is that the polymer residues cannot be completely removed by the HF solution. In addition, the cleaning step performed after the CMP step cannot remove the hydrocarbon particles and the slurry residues. This, in turn, causes a rough surface forming in a wafer. Consequently, a subsequent photolithography process fails.

SUMMARY OF THE INVENTION

The invention provides a method of cleaning a dual damascene structure. A first conductive layer is formed in a substrate. A dielectric layer is formed over the substrate. A dual damascene opening is formed in the dielectric layer to expose the first conductive layer. A $H_2O_2$ based aqueous solution is used to remove polymer residues in the dual damascene opening. A temperature of the $H_2O_2$ based aqueous solution is controlled so that the first conductive layer is not corroded. A diluted HF solution or a diluted HF and HCl solution is used to remove the polymer residues. A second conductive layer is formed over the substrate to fill the dual damascene opening. A chemical mechanical polishing process is performed with the dielectric layer serving as a polishing stop to remove the second conductive layer outside the dual damascene opening. A $H_2O_2$ based aqueous solution is used to clean the hydrocarbon particulates from the chemical mechanically polishing step. A diluted HF solution or a diluted HF and HCl solution is used to remove the slurry residues, such as silicon oxide of the slurry, from the chemical mechanical polishing step.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
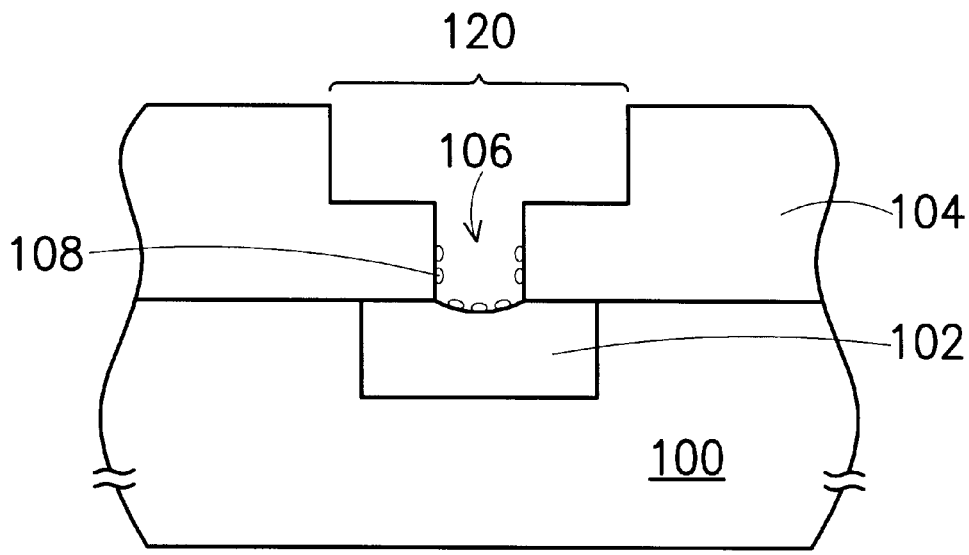
FIG. 1A is a schematic, cross-sectional view showing a substrate after forming and cleaning a dual damascene opening in a conventional dual damascene process.
Figure 1B:
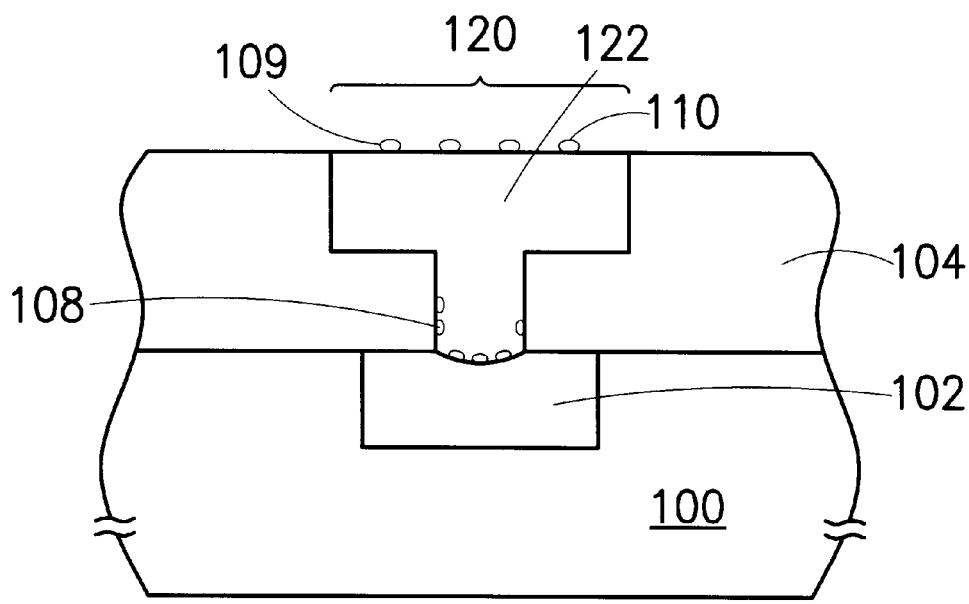
FIG. 1B is a schematic, cross-sectional view showing a substrate after performing a chemical mechanical polishing and a cleaning step in a conventional dual damascene process.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are cross-sectional views showing a process of fabricating a dual damascene structure according to one preferred embodiment of the invention.

Figure 2A:
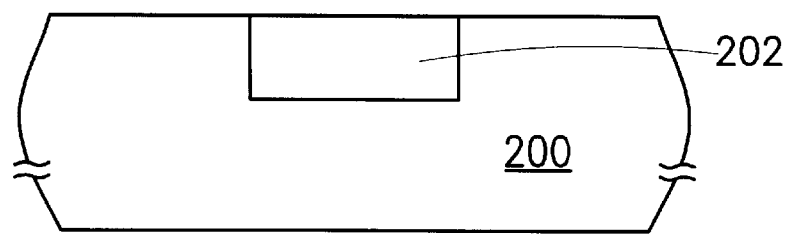
FIGS. 2A through 2F are cross-sectional views showing a process of fabricating a dual damascene structure according to one preferred embodiment of the invention.

In FIG. 2A, a conductive layer 202 is formed in the substrate 200. The material of the conductive layer 202 can be, for example, copper.

Figure 2B:
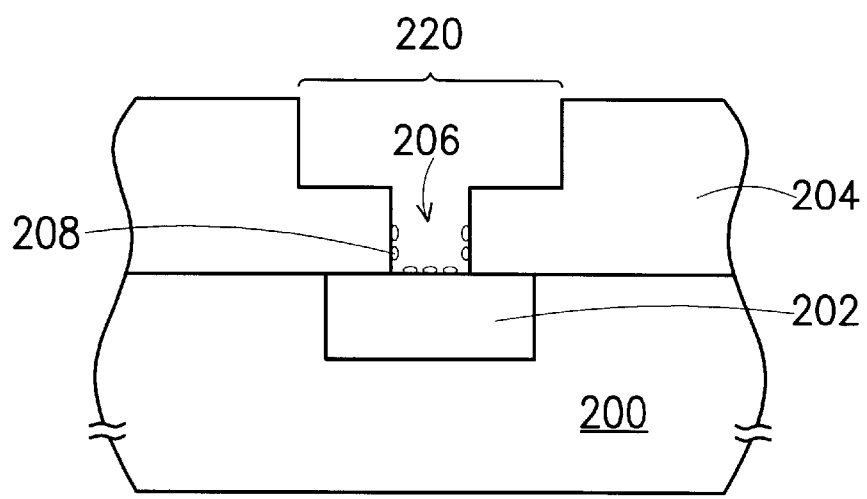

In FIG. 2B, a dielectric layer 204 is formed over the substrate 200. A dual damascene opening 220 exposing the conductive layer 202 is formed in the dielectric layer 204 by dry etching. However, after the etching step, polymer residues 208 easily remain in the dual damascene opening 220, especially in a via opening 220.

This embodiment takes the dual damascene opening 220 as an example. However, this invention is not limited to the dual damascene opening 220, the interconnection opening for forming interconnection can also be formed in the invention.

Figure 2C:
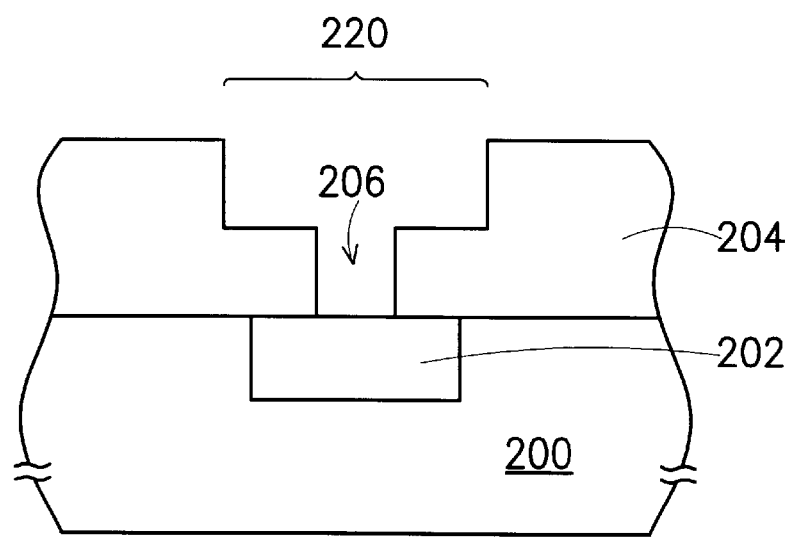

In FIG. 2C, a $H_2O_2$ based aqueous solution is used to clean the dual damascene opening 220. The efficiency of the cleaning step is determined by the temperature of the $H_2O_2$ based aqueous solution. The highest temperature of the $H_2O_2$ based aqueous solution is a temperature that does not corrode the conductive layer 202. Thus, the recess in the conductive layer 202 can be prevented. The $H_2O_2$ based aqueous solution is used to oxidize the polymer residues 208 in the via opening 206. The temperature of the $H_2O_2$ based aqueous solution is controlled within a range of about 30° C. to about 40° C. In addition, in the case that the conductive layer 202 is a copper layer, the $H_2O_2$ based aqueous solution also oxidizes the surface portion of the copper layer into a $CuO_x$ layer. Thereafter, a cleaning step is performed using a dilute HF solution or a diluted HF and HCl (HF/HCl) solution. The $CuO_x$ layer (not shown) on the copper layer can be removed. In addition, the polymer residues 208 can also be removed from the copper layer. Thus, the conductive layer 202 has a flat surface.

Figure 2D:
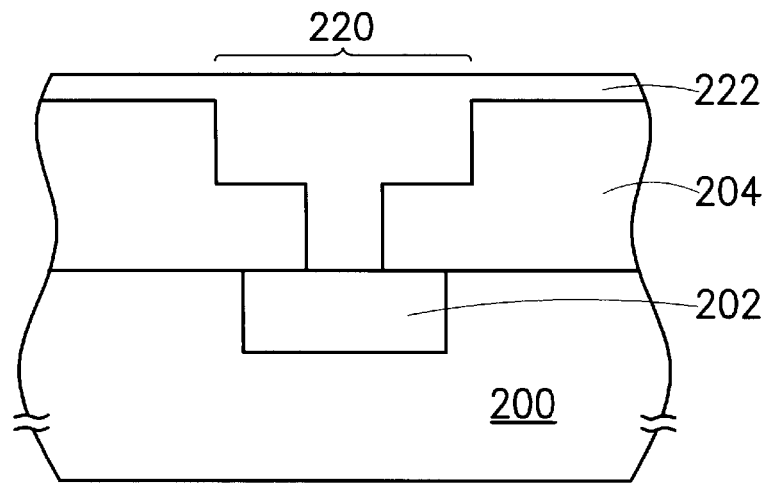

In FIG. 2D, a conductive layer 222 is formed over the dielectric layer 204 to fill the dual damascene opening 220. The material of the conductive layer 222 can be, for example, copper or platinum.

Figure 2E:
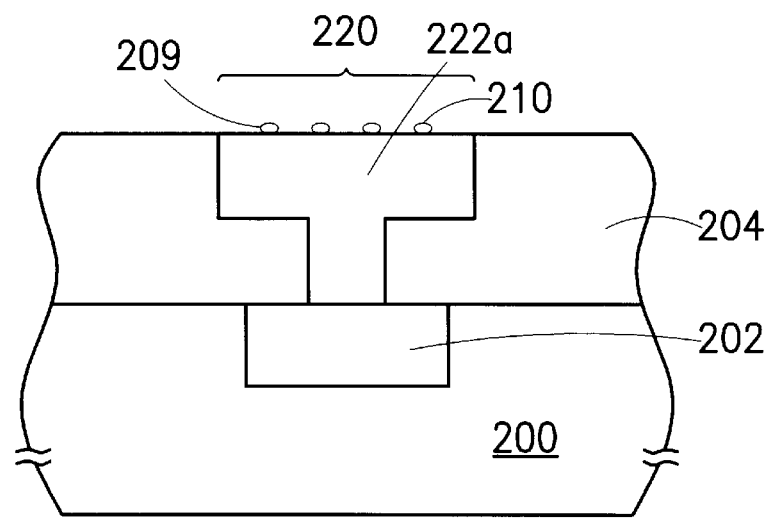

In FIG. 2E, the conductive layer 222 outside the dual damascene opening 220 is removed by a chemical mechanical polishing process with the dielectric layer 204 serving as a polishing stop. A dual damascene structure 222a is formed. During the chemical mechanical polishing process, benzotriazol (BTA) can be added into the slurry in order to decrease the corroding speed of the conductive layer 222 and prevent the conductive layer 222 from having a rough surface. In addition, a surfactant can also be added in the slurry in order to prevent the particulates from re-depositing onto the wafer. After the chemical mechanical polishing process, hydrocarbon particulates 209 and slurry residues 210 still remain on the dual damascene structure 222a.

Figure 2F:
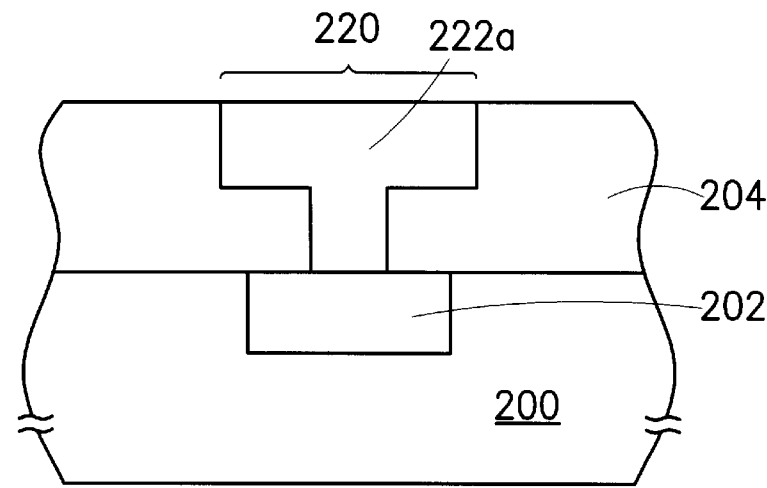

In FIG. 2F, using a $H_2O_2$ based aqueous solution to clean the dual damascene structure 222a. The hydrocarbon particulates 209, which are generated from the reaction between the dielectric layer 204 and the CMP slurry, are removed. At the same time, the temperature of the $H_2O_2$ based aqueous solution is controlled to prevent the dual damascene structure 222a from being overly corroded. Thereafter, a cleaning process is performed with a dilute HF solution or a dilute HF/HCl solution to remove the CMP slurry residues 210. In the cleaning process, a megasonic power can be applied to facilitate the removal of the particulates in order to obtain a clean and flat surface of the dual damascene structure 222a.

In summary, the invention has at least the following advantages:

1. In the cleaning step performed after the formation of the dual damascene opening or performed after the CMP step to remove a portion of the conductive layer, a $H_2O_2$ based aqueous solution is used to serve as a cleaning solution. The cleaning efficiency is determined by the temperature of the cleaning solution. The temperature of the cleaning solution cannot be the temperature that corrodes the conductive layer. In the cleaning step performed after the formation of the dual damascene opening, a $H_2O_2$ based aqueous solution is used to oxidize the polymer residues in order to facilitate the removal of the polymer residues. In the cleaning step performed after the CMP step, a $H_2O_2$ based aqueous solution is used to remove hydrocarbon particulates, which are generated from the reaction between the dielectric layer and the CMP slurry.

2. In the case that the conductive layer is a copper layer, the $H_2O_2$ based aqueous solution oxidizes the hydrocarbon polymer etching residues on the sidewall of the dual damascene opening. Additionally, the $H_2O_2$ based aqueous solution also oxidizes the copper layer into a $CuO_x$ layer. Consequently, in the subsequent cleaning step of using the HF solution, the conductive layer is prevented from being damaged.

3. In the cleaning step performed after the formation of the dual damascene opening, a dilute HF solution or a dilute HF/HCl solution is used to remove the polymer residues from the $CuO_x$ layer. Hence, the re-deposition of the polymer resides is prevented. In addition, the cleaning step performed after the CMP step, which removes the conductive layer outside the dual damascene opening, the dilute HF solution or a dilute HF/HCl solution is used to remove most CMP slurry resides.

4. The Magasonic power is applied to facilitate the removal of the particulates.

5. Benzotriazol is used in the CMP step to reduce the corroding speed of the conductive layer and prevent the recess from forming in the conductive layer.

6. A surfactant is used in the CMP step, the re-deposition of the particulates from the polishing step is prevented.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of cleaning a dual damascene structure, comprising:

providing a substrate, wherein a first conductive layer is formed in a substrate;

forming a dielectric layer over the substrate;

forming a dual damascene opening in the dielectric layer to expose the first conductive layer, after which a polymer residue remains in the dual damascene opening;

using a $H_2O_2$ based aqueous solution to oxidize the polymer residues in the dual damascene opening, wherein a temperature of the $H_2O_2$ based aqueous solution is in a in a range of about 30° C. to about 40° C. so that the first conductive layer is not corroded;

cleaning the dual damascene opening with a diluted HF solution or a diluted HF and HCl solution;

forming a second conductive layer over the substrate to fill the dual damascene opening;

performing a chemical mechanical polishing process to remove the second conductive layer outside the dual damascene opening, wherein a dual damascene structure is formed;

using a $H_2O_2$ based aqueous solution to clean the dual damascene structure and controlling a temperature of a $H_2O_2$ based aqueous solution so that the dual damascene structure is not overly corroded; and cleaning the dual damascene structure with a diluted HF solution or a diluted HF and HCl solution.

2. The method of claim 1, wherein a material of the first conductive layer comprises copper.

3. The method of claim 1, further comprising using a slurry containing benzotrialzol while performing the chemical mechanical polishing process to remove the second conductive layer outside the dual damascene opening.

4. The method of claim 1, further comprising using a slurry containing a surfactant while performing the chemical mechanical polishing process to remove the second conductive layer outside the dual damascene opening.

5. The method of claim 1, wherein the dual damascene opening is formed by dry etching.

6. The method of claim 1, further comprising applying a megasonic power to clean the dual damascene structure after the step of performing the chemical mechanical polishing process to remove the second conductive layer outside the dual damascene opening.

7. The method of claim 1, wherein a material of the second conductive layer comprises copper.

8. The method of claim 1, wherein a material of the second conductive layer comprises platinum.

9. A method of cleaning a metal interconnection structure, comprising:

providing a substrate, wherein a first conductive layer is formed in a substrate;

forming a dielectric layer over the substrate;

forming an opening in the dielectric layer to expose the first conductive layer, after which a polymer residue remains in the opening;

using a $H_2O_2$ based aqueous solution to oxidize the polymer residues in the opening, wherein a temperature of the $H_2O_2$ based aqueous solution is in a range of about 30° C. to about 40° C. so that the first conductive layer is not corroded;

cleaning the opening with a diluted HF solution or a diluted HF and HCl solution;

forming a second conductive layer over the substrate to fill the opening;

performing a chemical mechanical polishing process to remove the second conductive layer outside the opening using the dielectric layer as a polishing stop, wherein a metal interconnection structure is formed;

using a $H_2O_2$ based aqueous solution to clean the metal interconnection structure and controlling a temperature of a $H_2O_2$ based aqueous solution so that the metal interconnection structure is not overly corroded; and cleaning the metal interconnection structure with a diluted HF solution or a diluted HF and HCl solution.

10. The method of claim 9, wherein a material of the first conductive layer comprises copper.

11. The method of claim 9, further comprising using a slurry containing benzotrialzol while performing the chemical mechanical polishing process to remove the second conductive layer outside the opening.

12. The method of claim 9, further comprising using a slurry containing a surfactant while performing the chemical mechanical polishing process to remove the second conductive layer outside the opening.

13. The method of claim 9, further comprising applying a megasonic power to clean the metal interconnection structure after the step of performing the chemical mechanical polishing process to remove the second conductive layer outside the opening.

14. The method of claim 9, wherein a material of the second conductive layer comprises copper.

15. The method of claim 9, wherein a material of the second conductive layer comprises platinum.

* * * * *